(12) United States Patent
Wu

(10) Patent No.: US 11,063,111 B2
(45) Date of Patent: Jul. 13, 2021

(54) SEMICONDUCTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/264,059

(22) Filed: Jan. 31, 2019

(65) Prior Publication Data
US 2020/0105862 A1     Apr. 2, 2020

Related U.S. Application Data

(60) Provisional application No. 62/737,465, filed on Sep. 27, 2018.

(51) Int. Cl.
*H01L 49/02*     (2006.01)
*H01L 23/532*     (2006.01)
(Continued)

(52) U.S. Cl.
CPC ........ *H01L 28/40* (2013.01); *H01L 21/76832* (2013.01); *H01L 23/3171* (2013.01); *H01L 23/5226* (2013.01); *H01L 23/5283* (2013.01); *H01L 23/53214* (2013.01); *H01L 23/53228* (2013.01); *H01L 23/53295* (2013.01)

(58) Field of Classification Search
CPC ............... H01L 28/40; H01L 21/76832; H01L 23/3171; H01L 23/5283; H01L 23/53295; H01L 23/5226; H01L 23/53214; H01L 23/53228
See application file for complete search history.

(56) References Cited

U.S. PATENT DOCUMENTS 5,742,471 A * 4/1998 Barbee, Jr. ............... H01G 4/10
  29/25.42
6,284,657 B1 * 9/2001 Chooi ............... H01L 21/76801
  257/E21.576

(Continued)

FOREIGN PATENT DOCUMENTS

CN    103579357 A    2/2014

OTHER PUBLICATIONS

Office Action and Cite Reference dated Feb. 3, 2021 issued by the China National Intellectual Property Administration for the Chinese Application No. 201910882882.1.
(Continued)

*Primary Examiner* — Yasser A Abdelaziez
(74) *Attorney, Agent, or Firm* — WPAT, P.C., Intellectual Property Attorneys; Anthony King

(57) ABSTRACT

The present disclosure provides a semiconductor structure, including a bottom terminal, a middle terminal over the bottom terminal and separated from the bottom terminal by a high-k dielectric layer, a top terminal over the middle terminal and separated from the middle terminal by the high-k dielectric layer, and a silicon nitride layer over the top terminal and directly on the high-k dielectric layer.

20 Claims, 13 Drawing Sheets

(51) Int. Cl.
  *H01L 23/522* (2006.01)
  *H01L 23/528* (2006.01)
  *H01L 23/31* (2006.01)
  *H01L 21/768* (2006.01)

(56) References Cited

U.S. PATENT DOCUMENTS

| | | | |
|---|---|---|---|
| 6,573,584 B1 | 6/2003 | Nagakari et al. | |
| 2001/0030352 A1* | 10/2001 | Ruf | H01L 27/10861 |
| | | | 257/532 |
| 2012/0199946 A1* | 8/2012 | Kageyama | H01L 28/60 |
| | | | 257/532 |
| 2013/0320493 A1* | 12/2013 | Chang | H01L 23/49822 |
| | | | 257/532 |
| 2014/0021473 A1 | 1/2014 | Yu et al. | |
| 2014/0159200 A1* | 6/2014 | Loke | H01L 23/5223 |
| | | | 257/532 |
| 2015/0108607 A1 | 4/2015 | Chen et al. | |
| 2015/0115404 A1* | 4/2015 | Hsueh | H01L 23/5223 |
| | | | 257/531 |
| 2016/0276426 A1* | 9/2016 | Yang | H01L 23/5223 |
| 2018/0006108 A1* | 1/2018 | Ando | H01L 28/75 |
| 2018/0145128 A1 | 5/2018 | Wang et al. | |
| 2020/0035595 A1* | 1/2020 | Wu | H01L 24/13 |
| 2020/0098685 A1* | 3/2020 | Lee | H01L 21/76877 |

OTHER PUBLICATIONS

US20140021473A1 corresponds to CN103579357A.

\* cited by examiner

SEMICONDUCTOR STRUCTURE AND MANUFACTURING METHOD FOR THE SAME

CROSS REFERENCE TO RELATED APPLICATIONS

This application claims the benefit of prior-filed provisional application No. 62/737,465, filed Sep. 27, 2018, which is incorporated by reference in its entirety.

BACKGROUND

Transistor devices of the integrated chips are configured to enable logical functionality for an integrated chip, such as capacitors, resistors, inductors, varactors, or other passive devices.

Capacitor is one of the transistor devices which can be used to store electric potential energy. Capacitors may also be used to block direct current while allowing alternating current to pass, smooth the output of power supplies, tune frequencies, or stabilize voltage and power flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
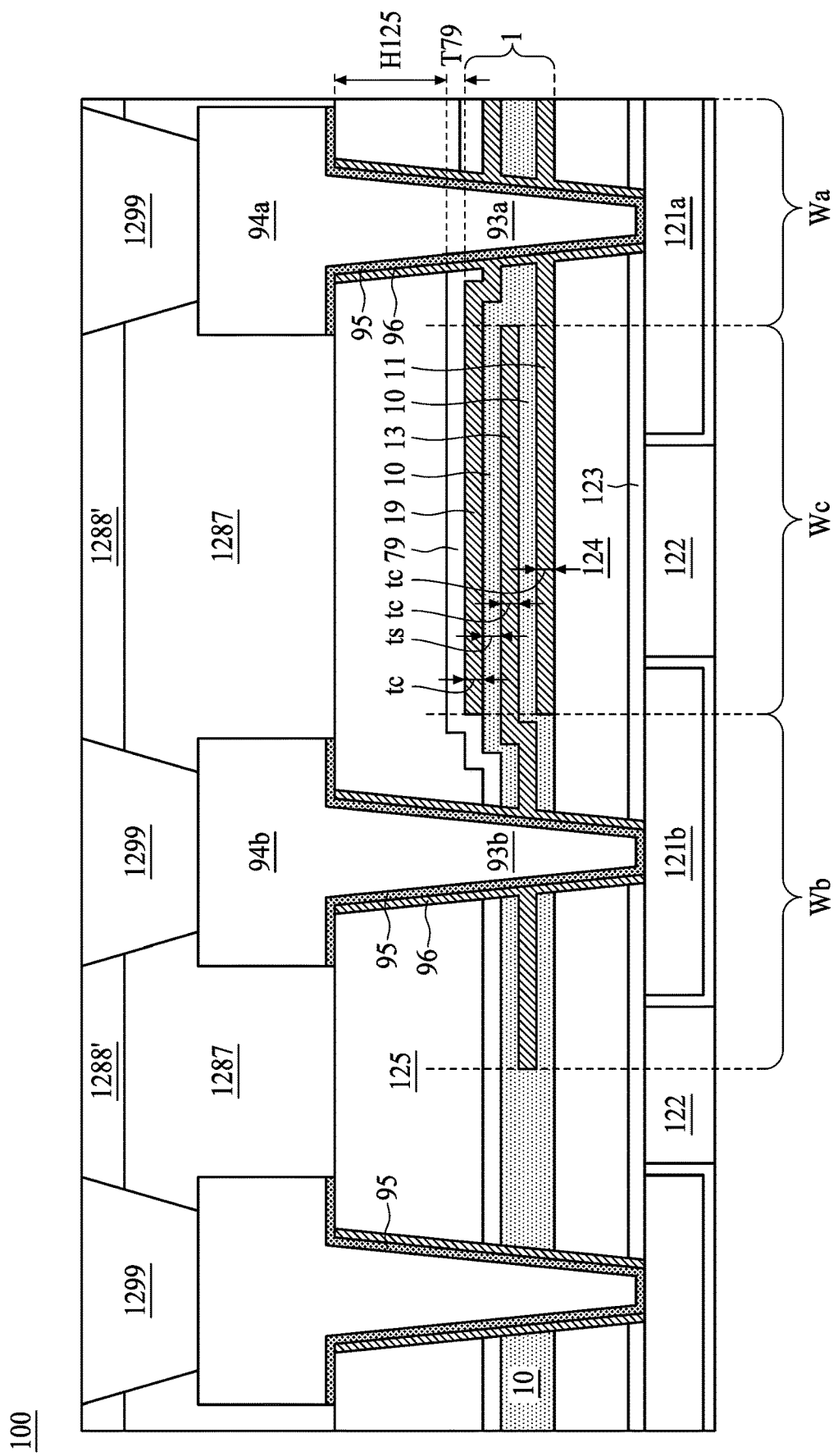
FIG. 1 is a cross sectional views of semiconductor structures, according to some embodiments of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Metal-insulator-metal (MIM) capacitor is one of the types of capacitors. Metal-insulator-metal capacitors include at least two terminals separated by dielectric layers. MIM capacitors may be used to store electric potential energy, voltage regulation, and/or mitigate noise. Along the path of device miniaturization, conventional capacitors may suffer from delamination or cracking due to stress concentration incurred by external forces. Specifically, a high-k dielectric layer between the terminals, a high-k dielectric layer above the MIM capacitor or high-k dielectric layer adjacent to a redistribution vias (RV) may suffer from delamination, void induction, cracking and/or defect induction.

In addition, during the operation of etching a redistribution via trench, some residues (e.g. oxide defects) may be generated in the redistribution via trench. Therefore, a cleaning solution is applied in the redistribution via trench in order to remove the residues therefrom. However, some cleaning solutions are corrosive to a sidewall of the redistribution via trench, so the sidewall of the redistribution via trench may be damaged by the cleaning solution applied thereon. As a result, the voids, defects, or cracking can be incurred on the sidewall of the redistribution via trench, which causes reliability issues in subsequent fabrication operations.

Referring to FIG. 1, FIG. 1 is a cross section of a semiconductor structure 100, in accordance with some embodiments of the present disclosure. A first metal line 121*a* and a second metal line 121*b* are disposed in inter-metal dielectrics (IMDs) 122. The first metal line 121*a* and the second metal line 121*b* may be composed of substantially pure copper (for example, with a weight percentage of copper being greater than about 90 percent, or greater than about 95 percent) or copper alloys. The first metal line 121a and the second metal line 121b may be, or may not be, substantially free from aluminum. The IMDs 122 may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 122 may also be close to 3.8. In some embodiments, the k values of the low-k dielectric materials are lower than about 3.0, and may be lower than about 2.5. In some embodiments, the first metal line 121a and the second metal line 121b are top metal lines. The top surfaces of the first metal line 121a, the second metal line 121b, and the IMDs 122 may be coplanar.

The semiconductor structure 100 optionally includes a bottom etch stop layer 123 above the top surfaces of the first metal line 121a, the second metal line 121b, and the IMDs 122. A first passivation layer 124 is disposed above the bottom etch stop layer 123. The bottom etch stop layer 123 may include silicon nitride (SiN), or the like. In some embodiments, the first passivation layer 124 may be composed of glass, such as un-doped Silicate Glass (USG), or the like. In some other embodiments, the first passivation layer 124 may be composed of oxide layer, such as plasma enhanced deposited oxide, or the like. However, the material of the first passivation layer 124 may not be limited thereto; materials which can provide sufficient supporting strength and a low-roughness top surface are also under consideration. A capacitor stack 1 is disposed above the first passivation layer 124, wherein a thickness of the first passivation layer 124 is in a range from about 2,700 Angstrom to about 3,300 Angstrom, which can provide sufficient mechanical strength while reducing the aspect ratio of subsequently formed vias penetrating the first passivation layer 124, as will be introduced subsequently.

The capacitor stack 1 at least includes a bottom terminal 11, a middle terminal 13 above the bottom terminal 11, and a top terminal 19 above the middle terminal 13. In some embodiments, a material of the bottom terminal 11, the middle terminal 13, and the top terminal 19 may include conductive materials, such as titanium nitride (TiN), titanium (Ti), aluminum (Al), indium tin oxide (ITO), tungsten (W), tungsten nitride (WN), tantalum nitride (TaN), tantalum (Ta), rhenium trioxide ($ReO_3$), rhenium oxide ($ReO_2$), iridium oxide ($IrO_2$), ruthenium (Ru), osmium (Os), palladium (Pd), platinum (Pt), copper (Cu), molybdenum nitride (MoN), molybdenum (Mo), conductive metal, the combination thereof, or the like. For exemplary demonstration, each of a thickness tc of the bottom terminal 11, the middle terminal 13, and the top terminal 19 may be around 400 Angstrom, but the present disclosure is not limited thereto.

The bottom terminal 11 is disposed on a top surface of the first passivation layer 124 and above the first metal line 121a. In some embodiments, the bottom terminal 11 conforms to a portion of the top surface of the first passivation layer 124. Each of the bottom terminal 11, the middle terminal 13, and the top terminal 19 includes at least a portion overlapping a capacitance region Wc of the capacitor stack 1, forming a capacitor between the bottom terminal 11 and the middle terminal 13 within the capacitance region Wc, and another capacitance space between the middle terminal 13 and the top terminal 19 within the capacitance region Wc.

The capacitor stack 1 further includes a high-k dielectric layer 10, herein the high-k dielectric layer 10 separates the bottom terminal 11 from the middle terminal 13 and separates the middle terminal 13 from the top terminal 19. The high-k dielectric layer 10 provides a separation ts spacing between each of the terminals. For exemplary demonstration, the separation ts spacing between adjacent terminals within the capacitance region Wc may be around 60 Angstrom. In some embodiment, the high-k dielectric layer 10 may be a zirconium oxide ($ZrO_2$)-aluminum oxide ($Al_2O_3$)-zirconium oxide ($ZrO_2$) tri-layer. In some embodiments, each layer of the tri-layer in the high-k dielectric layer 10 has identical thickness, as in the case of the separation ts being around 60 Angstrom, each layer of the tri-layer is around 20 Angstrom. In some other embodiments, the high-k dielectric layer 10 may include aluminum oxide ($Al_2O_3$), zirconium oxide ($ZrO_2$), silicon nitride ($Si_3N_4$), tantalum nitride ($Ta_2O_5$), titanium oxide ($TiO_2$), strontium titanate ($SrTiO_3$), yttrium oxide ($Y_2O_3$), lanthanum oxide ($La_2O_3$), hafnium oxide ($HfO_2$), a multi-layer structure of the combination thereof, or the like. In some embodiments, the middle terminal 13 is surrounded by the high-k dielectric layer 10. The high-k dielectric layer 10 may further extend to cover a portion of the top surface of the first passivation layer 124. In some embodiments, the capacitor stack 1 may further include one or more terminals between the bottom terminal 11 and the top terminal 19.

The bottom terminal 11 further includes a portion within a first region Wa, herein the first region Wa is adjacent to the capacitance region Wc and above the first metal line 121a. The top terminal 19 may also include a portion within the first region Wa above at least a portion of the first metal line 121a. In contrast, the middle terminal 13 include a portion within a second region Wb, wherein the second region Wb is adjacent to the capacitance region Wc and above at least a portion of the second metal line 121b. In some embodiments, the middle terminal 13 and the top terminal 19 may be formed in plate shape. In some other embodiments, the middle terminal 13 and the top terminal 19 may include portions leveling with various planes, for example a stepped shape.

The capacitor stack 1 may be at risk of delamination, wherein delamination may be incurred between the high-k dielectric layer 10 and terminals (including the bottom terminal 11, the middle terminal 13, the top terminal 19) due to mechanical stress applied on the capacitor stack 1, and/or cracks may be incurred in the capacitor stack 1. In order to alleviate the risk of delamination induced in the capacitor stack 1, a capping layer 79 is formed directly on the high-k dielectric layer 10 and directly over the top terminal 19. The capping layer 79 has a greater mechanical strength than that of the capacitor stack 1, thus the capping layer 79 may further alleviate the affection of external force applied on the capacitor stack 1 and/or reduce the risk of detachment or cracks incurred between the high-k dielectric layer 10 and aforementioned terminals by capping above the capacitor stack 1. In some embodiments, the capping layer 79 may include nitride, such as silicon nitride (SiN). In some embodiments, the capping layer 79 may include a stack having an oxide buffer layer and a nitride layer over the oxide buffer layer. In some embodiments, a thickness T79 of the capping layer 79 may be comparable to a thickness tc of the bottom terminal 11, the middle terminal 13, and/or the top terminal 19, for example in a range from about 500 Angstrom to about 1,000 Angstrom. If the thickness T79 of the capping layer 79 is thinner than 500 Angstrom, the mechanical strength provided by the capping layer 79 is not enough to prevent the structural integrity of the capacitor stack 1 from being affected by the redistribution layer and chip-package interaction.

A second passivation layer 125 is formed above the capping layer 79. In some embodiments, a top surface of the second passivation layer 125 is substantially parallel to the top surface of the first passivation layer 124. In some embodiments, in order to provide sufficient mechanical strength to support the structure, a thickness H125 of the second passivation layer 125 (measured from a top surface of the capping layer 79 to a top surface of the second passivation layer 125) is at least 7,000 Angstrom, but the present disclosure is not limited thereto. A material of the second passivation layer 125 may be similar to the material of the first passivation layer 124, such as un-doped Silicate Glass (USG), plasma enhanced deposited oxide, or the like.

In some embodiments, the first passivation layer 124 may serve as a buffer layer spacing between a bottom surface of the capacitor stack 1 and the first metal line 121a as well as the second metal line 121b, reducing the potential of electrical shorting and mitigating the induction of parasitic capacitance. A first via 93a penetrates the first passivation layer 124, electrically connecting the top terminal 19 and the bottom terminal 11 to the first metal line 121a. A second via 93b penetrates the first passivation layer 124, electrically connecting the middle terminal 13 to the second metal line 121b.

The first via 93a is formed in the first region Wa, and being electrically connected to the first metal line 121a. The second via 93b is formed within the second area Wb and being electrically connected to the second metal line 121b. The first via 93a and the second via 93b may penetrates through the second passivation layer 125 and taper toward the first metal line 121a and the second metal line 121b respectively. Herein the second passivation layer 125, the capping layer 79, the bottom terminal 11 and the top terminal 19 are penetrated by the first via 93a, while the capping layer 79, the middle terminal 13 and the second passivation layer 125 are penetrated by the second via 93b. By separately connecting the bottom terminal 11 and the top terminal 19 to the first via 93a, and connecting the middle terminal 13 to the second via 93b, different voltages can be applied separately thereby. In some embodiments, the first via 93a and the second via 93b are composed of conductive materials, for example aluminum copper (AlCu), which may provide sufficient conductivity with lower cost. It should be noted that if a total amount of terminals are more than 3, the configuration may be varied accordingly.

A first conductive post 94a is disposed above and being electrically connected to the first via 93a, while a second conductive post 94b is disposed above and being electrically connected to the second via 93b. In some embodiments, the first conductive post 94a and the second conductive post 94b may have substantially constant width. The width of the first conductive post 94a is greater than a width of a top surface of the first via 93a, while the width of the second conductive post 94b is greater than a width of a top surface of the second via 93b. The first conductive post 94a and the second conductive post 94b may be composed of the same conductive material of the first via 93a and the second via 93b, which may be aluminum copper (AlCu). In some embodiments, each of the first conductive post 94a and the second conductive post 94b may have a height around 28,000 Angstrom.

The capping layer 79 and the second passivation layer 125 may alleviate the affection of stress incurred by the weight of the first conductive post 94a, the second conductive post 94b, and external forces applied on the capacitor stack 1, wherein such stress may further cause cracks, deformation, peeling, delamination, or defects. In order to provide sufficient mechanical strength to support the structure, the thickness H125 of the second passivation layer 125 to a top surface of the top terminal 19 is at least 7,000 Angstrom, and the capping layer 79 has the thickness T79 of at least 500 Angstrom. However, voids may be formed while forming the conductive material in the first via 93a and the second via 93b due to the high aspect ratio thereof. Thence, the thickness T79 of the capping layer 79 may be less than 1,000 Angstrom and/or a thickness H124 of the first passivation layer 124 being in a range from about 2,700 Angstrom to about 3,300 Angstrom. Such thickness arrangement can provide sufficient mechanical strength while reducing the aspect ratio of the first via 93a and the second via 93b, further mitigating formation of voids. In some embodiments, when a thickness of the first via 93a and the second via 93b are greater than a predetermined height (for example, 15,000 Angstrom), the risk of causing key holes, or voids, during the deposition of the conductive material (for example, aluminum-copper) may be increased. Therefore, the thickness T79 of the capping layer 79 may be less than 1,000 Angstrom to lower the aspect ratio of the first via 93a and the second via 93b. On the other hand, when the capping layer 79 is composed of silicon nitride, the capping layer 79 being too thick would also exert excessive stress to the underlying capacitor stack 1 and cause cracks, deformation, peeling, delamination, or defects.

The semiconductor structure 100 further includes a spacer 96 respectively on a sidewall of the first via 93a and a sidewall of the second via 93b. The spacer 96 is configured to contact the sidewall of the first via 93a and the sidewall of the second via 93b to fill in voids or cracks as a result of formation of via trenches. Alternatively stated, the spacer 96 directly contacts a sidewall of the first passivation layer 124, a sidewall of the second passivation layer 125, at least one of the terminals (e.g. contacting a sidewall of the middle terminal 13 or contacting a sidewall of the bottom terminal 11 and a sidewall of the top terminal 19), a sidewall of the high-k dielectric layer 10, a sidewall of the capping layer 79, and optionally further contacting a sidewall of the bottom etch stop layer 123. A material of the spacer 96 can be different from the first passivation layer 124, the second passivation layer 125, and the conductive material of the first via 93a or the second via 93b. In some embodiments, a material of the spacer 96 can be identical to the material of one of the top terminal 19, the middle terminal 13, and the bottom terminal 11, for example, titanium nitride (TiN) or other suitable materials previously discussed. It should be noted that the material of spacer 96 may be conductive, thus that the bottom terminal 11 and/or the top terminal 19 can be electrically connected to the first via 93a, and the middle terminal 13 can be electrically connected to the second via 93b, as depicted in FIG. 1.

In addition, during an operation of forming via trenches prior to forming the first via 93a and the second via 93b, chemical residues may be formed in the via trenches under dry etch operation or wet etch operation. Therefore, a cleaning solution can be applied in the via trenches to remove the residues therefrom. However, some cleaning solution is corrosive to the sidewall of the via trenches, thence the cleaning solution may damage the sidewall of the via trenches, inducing cracking, deformation, delamination, voids, and/or peeling in subsequent fabrication operations and further cause reliability issues due to stress concentration. Thus, the configuration of the spacer 96 can repair the micro cracks or defects on the sidewall of the via trenches and enhance the mechanical strength of the via trenches to alleviate the risk of cracking, deformation, voids, delamination, and/or peeling. In some embodiments, a thickness of the spacer 96 is in a range from 1,000 Angstrom to 2,000 Angstrom to provide sufficient mechanical strength while providing enough opening space for the formation of the first via 93a or the second via 93b in consideration of electrical conductivity and manufacturing feasibility.

In some embodiments, the spacer 96 can be composed of high-k dielectric material to repair the micro cracks or defects on the sidewall of the via trenches. Since high-k dielectric material can adversely affect the conductivity between the vias 93a, 93b and the terminals 11, 13, 19, thickness of the high-k dielectric material may be determined to be thin enough to minimize this effect.

In some embodiments, the semiconductor structure 100 further include a barrier layer 95 adhering and spacing between the spacer 96 and the first via 93a as well as the spacer 96 and the second via 93b. Alternatively stated, the spacer 96 is spacing between the barrier layer 95 and the sidewall of the first via 93a as well as the sidewall of the second via 93b. The barrier layer 95 may further space between the second passivation layer 125 and a portion of the first conductive post 94a and/or a portion of the second conductive post 94b. In some embodiments, the barrier layer 95 further spaces between the first via 93a and a top surface of the first metal line 121a; and spaces between the second via 93b and the second metal line 121b. The barrier layer 95 may alleviate diffusion incurred between the first metal line 121a and the first via 93a, as well as the second metal line 121b and the second via 93b. In some embodiments, the barrier layer 95 may include tantalum (Ta), tantalum nitride (TaN), titanium nitride (TiN), the combination thereof, or the like. It should be noted that the spacer 96 may optionally include a bottom portion (not shown in FIG. 1) between the barrier layer 95 and the first metal line 121a or the second metal line 121b.

An upper passivation layer 1287 is disposed above the second passivation layer 125, surrounding the first conductive post 94a, the second conductive post 94b, and metal contacts 1299 above each of the first conductive post 94a and the second conductive post 94b. In some embodiments, the upper passivation layer 1287 may be composed of materials similar to the first passivation layer 124, such as un-doped Silicate Glass (USG), plasma enhanced deposited oxide, the combination thereof, or the like. An upper etch stop layer 1288' is disposed above the upper passivation layer 1287, wherein the upper etch stop layer 1288' may include silicon nitride (SiN), or the like. A top surface of the upper etch stop layer 1288' is coplanar with a top surface of the metal contact 1299. The contact 1299 may optionally bonded or electrically connected to other semiconductor structures.

Figure 2:
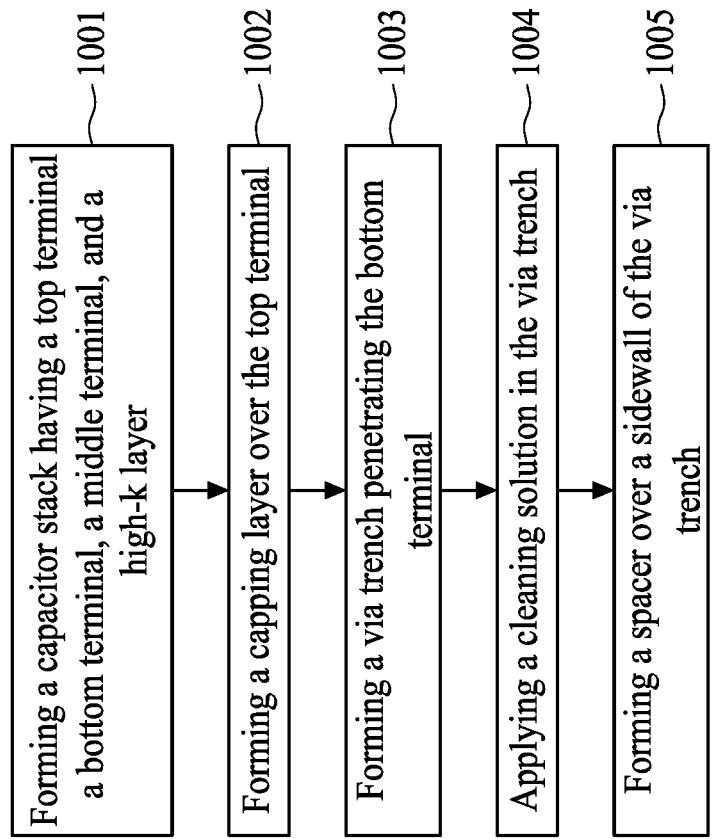
FIG. 2 shows a flow chart representing method of fabricating a semiconductor structure, in accordance with some embodiments of the present disclosure.

Referring to FIG. 2, FIG. 2 shows a flow chart representing method of fabricating a semiconductor structure, in accordance with some embodiments of the present disclosure. The method 1000 of forming the semiconductor structure 100 may include forming a capacitor stack having a top terminal, a bottom terminal, a middle terminal, and a high-k layer (operation 1001), forming a capping layer over the top terminal (operation 1002), forming a via trench penetrating the bottom terminal (operation 1003), applying a cleaning solution in the via trench (operation 1004), and forming a spacer over a sidewall of the via trench (operation 1005).

Figure 3A:
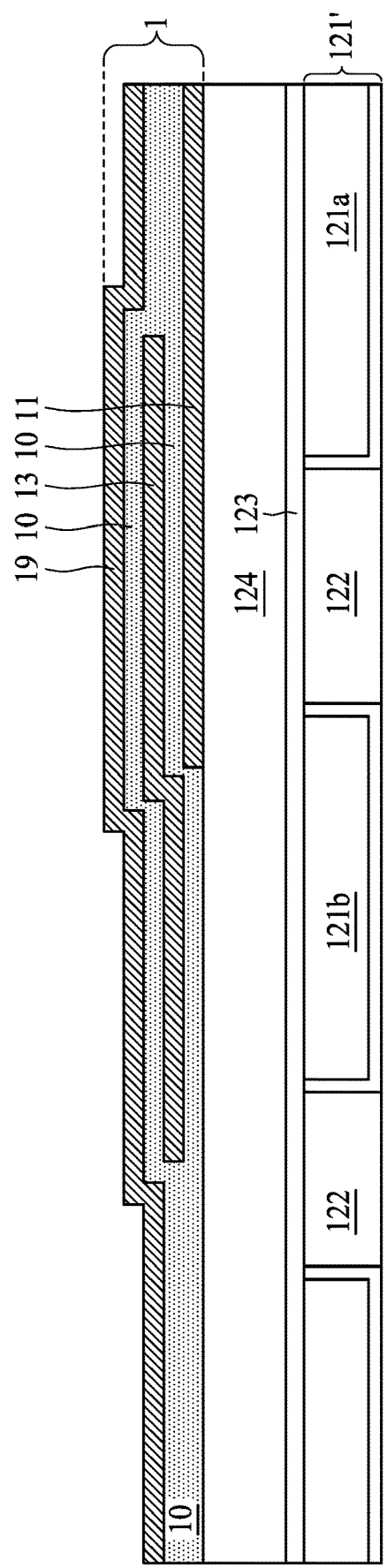
FIG. 3A to FIG. 3K are cross sectional views of semiconductor structures during intermediate stages of manufacturing operations, according to some embodiments of present disclosure.

Referring to FIG. 3A, FIG. 3A is a cross section of a semiconductor structure during an intermediate stage of manufacturing operations, in accordance with some embodiments of the present disclosure. The first metal line 121a and the second metal line 121b are formed in inter-metal dielectrics (IMDs) 122. The first metal line 121a and the second metal line 121b may be formed by a variety of techniques, e.g., single and/or dual damascene processes, electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The IMDs 122 may be formed of oxides such as un-doped Silicate Glass (USG), Fluorinated Silicate Glass (FSG), low-k dielectric materials, or the like. A planarization operation, such as chemical mechanical planarization (CMP) operation, is performed on the top surfaces of the first metal line 121a, the second metal line 121b and the IMDs 122. The bottom etch stop layer 123 is optionally formed above the first metal line 121a, the second metal line 121b and the IMDs 122. The first passivation layer 124 is disposed above the bottom etch stop layer 123. The first passivation layer 124 may be composed of glass, such as un-doped Silicate Glass (USG), or the like. In some other embodiments, the first passivation layer 124 may be composed of oxide layer, such as plasma enhanced deposited oxide, or the like. In some embodiments, the first passivation layer 124 may be may be formed by spin coating, deposition, plasma enhanced deposition, or the like. In some embodiments, a thickness of the first passivation layer 124 may be in a range from about 2,700 Angstrom to about 3,300 Angstrom, as previously discussed in FIG. 1.

The bottom terminal 11 is disposed above the first passivation layer 124, herein the bottom terminal 11 covers at least a portion of the first region Wa and at least a portion of the capacitance region Wc, as at least a portion of a top surface of the first passivation layer 124 within the second region Wb is exposed from the bottom terminal 11. The top surface of the first passivation layer 124 exposing for the bottom terminal 11 is covered by the high-k dielectric layer 10. In some embodiments, the forming of the high-k dielectric layer 10 may include laminating $ZrO_2$—$Al_2O_3$—$ZrO_2$ tri-layer. The middle terminal 13 has a portion within the second region Wb and a portion within the capacitance region Wc, herein the high-k dielectric layer 10 is formed above the bottom terminal 11, spacing between the middle terminal 13 and the bottom terminal 11. The high-k dielectric layer 10 is further formed above the first region Wa, the second region Wb, and the capacitance region Wc, covering the middle terminal 13. The top terminal 19 is further formed above the high-k dielectric layer 10 over the first region Wa, the second region Wb, and the capacitance region Wc.

Figure 3B:
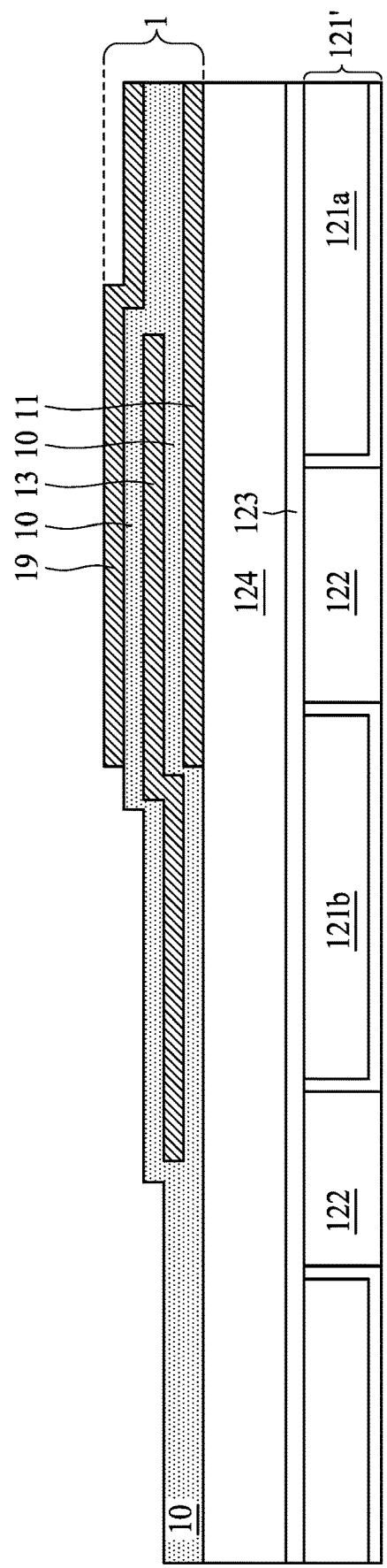

Referring to FIG. 3B, FIG. 3B is a cross section of a semiconductor structure during an intermediate stage of manufacturing operations, in accordance with some embodiments of the present disclosure. At least a portion of the top terminal 19 within the second region Wb is removed. The remained portion of the top terminal 19, middle terminal 13, and the bottom terminal 11 may compose the terminals of the capacitor stack 1.

Figure 3C:
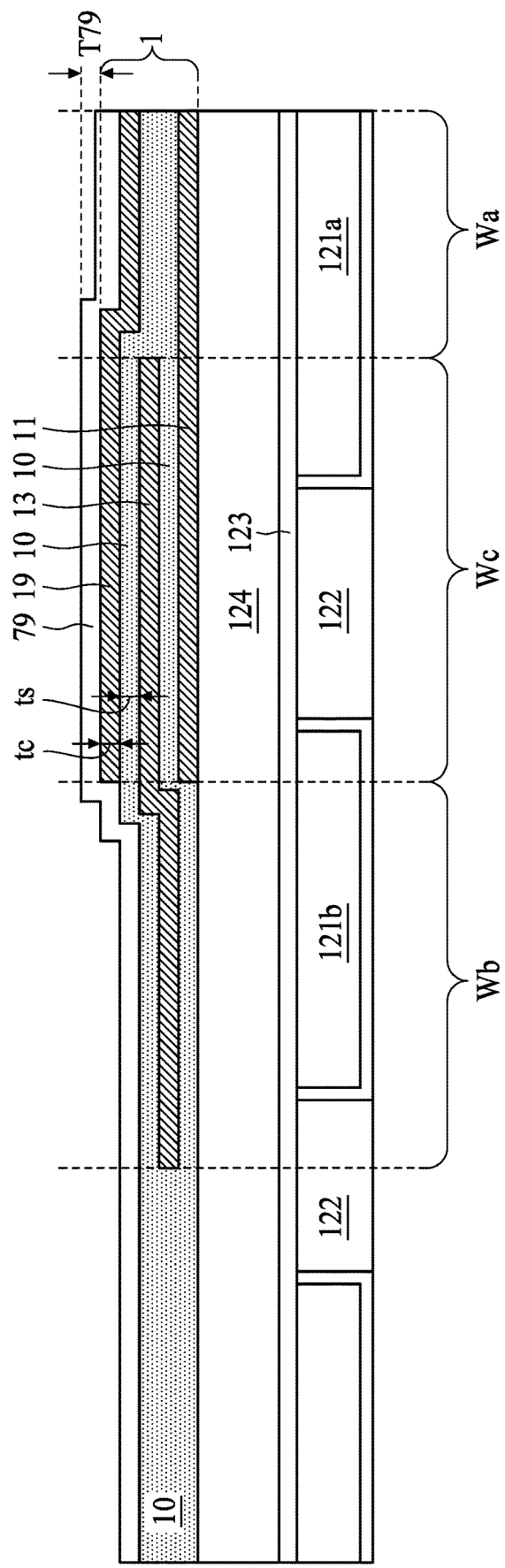

Referring to FIG. 3C, FIG. 3C is a cross section of a semiconductor structure during an intermediate stage of manufacturing operations, in accordance with some embodiments of the present disclosure. In order to alleviate the risk of delamination or cracking induced in the capacitor stack 1, a capping layer 79 is conformably formed directly on the high-k dielectric layer 10 and directly over the top terminal 19, herein the capping layer 79 has a stronger mechanical strength than the capacitor stack 1, thus the capping layer 79 may further alleviate the affection of external force applied on the capacitor stack 1 and/or reduce the risk of detachment or cracks incurred between the high-k dielectric layer 10 and aforementioned terminals. In some embodiments, the capping layer 79 may include nitride, such as silicon nitride (SiN). In some embodiments, the capping layer 79 may include a stack having an oxide buffer layer and a nitride layer over the oxide buffer layer. In some embodiments, the thickness T79 of the capping layer 79 may be comparable to a thickness tc of the bottom terminal 11, the middle terminal 13, and/or the top terminal 19, for example in a range from about 500 Angstrom to about 1,000 Angstrom. If the thickness T79 of the capping layer 79 is thinner than 500 Angstrom, the mechanical strength provided by the capping layer 79 is not enough to prevent the structural integrity of the capacitor stack 1 from being affected by the redistribution layer and chip-package interaction.

Figure 3D:
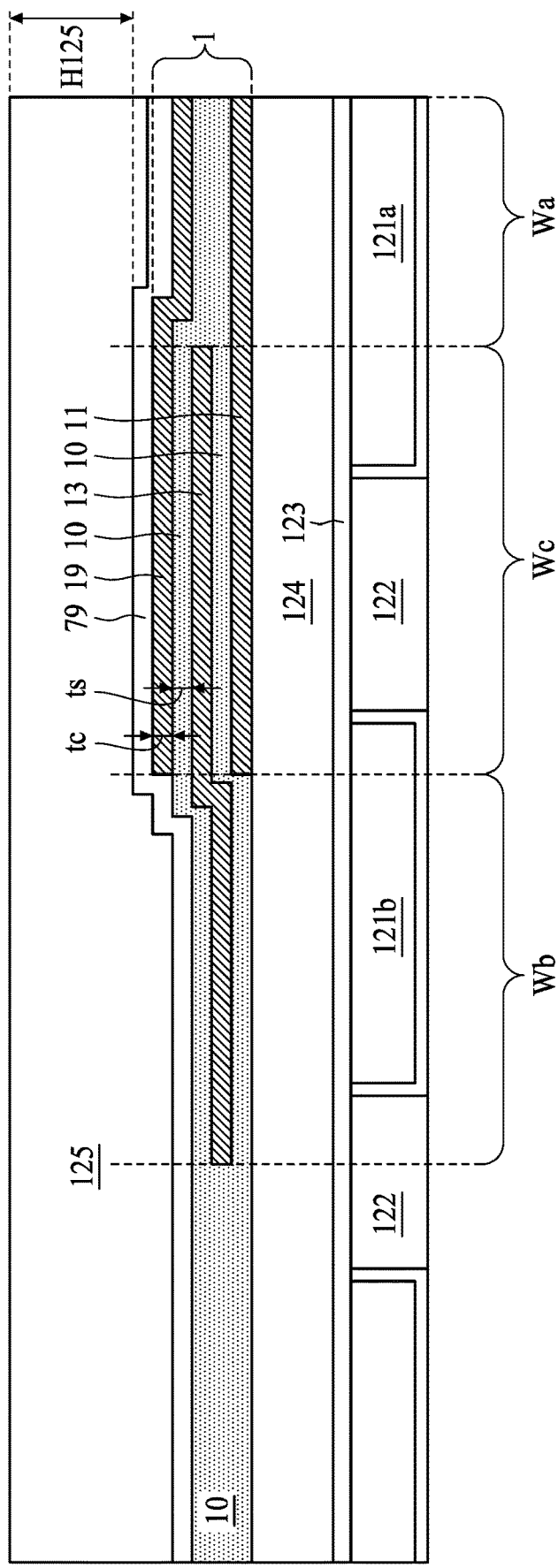

Referring to FIG. 3D, FIG. 3D is a cross section of a semiconductor structure during an intermediate stage of manufacturing operations, in accordance with some embodiments of the present disclosure. The second passivation layer 125 is formed above the capping layer 79, wherein a material of the second passivation layer 125 may be similar to the material of the first passivation layer 124, such as un-doped Silicate Glass (USG), plasma enhanced deposited oxide, or the like. The second passivation layer 125 may be formed by a variety of techniques, e.g., spin-on coating, deposition, plasma enhanced deposition, or the like. As previously discussed in FIG. 1, in some embodiments, in order to provide sufficient mechanical strength to support the structure, a thickness H125 of the second passivation layer 125 is at least 7,000 Angstrom, but the present disclosure is not limited thereto.

Figure 3E:
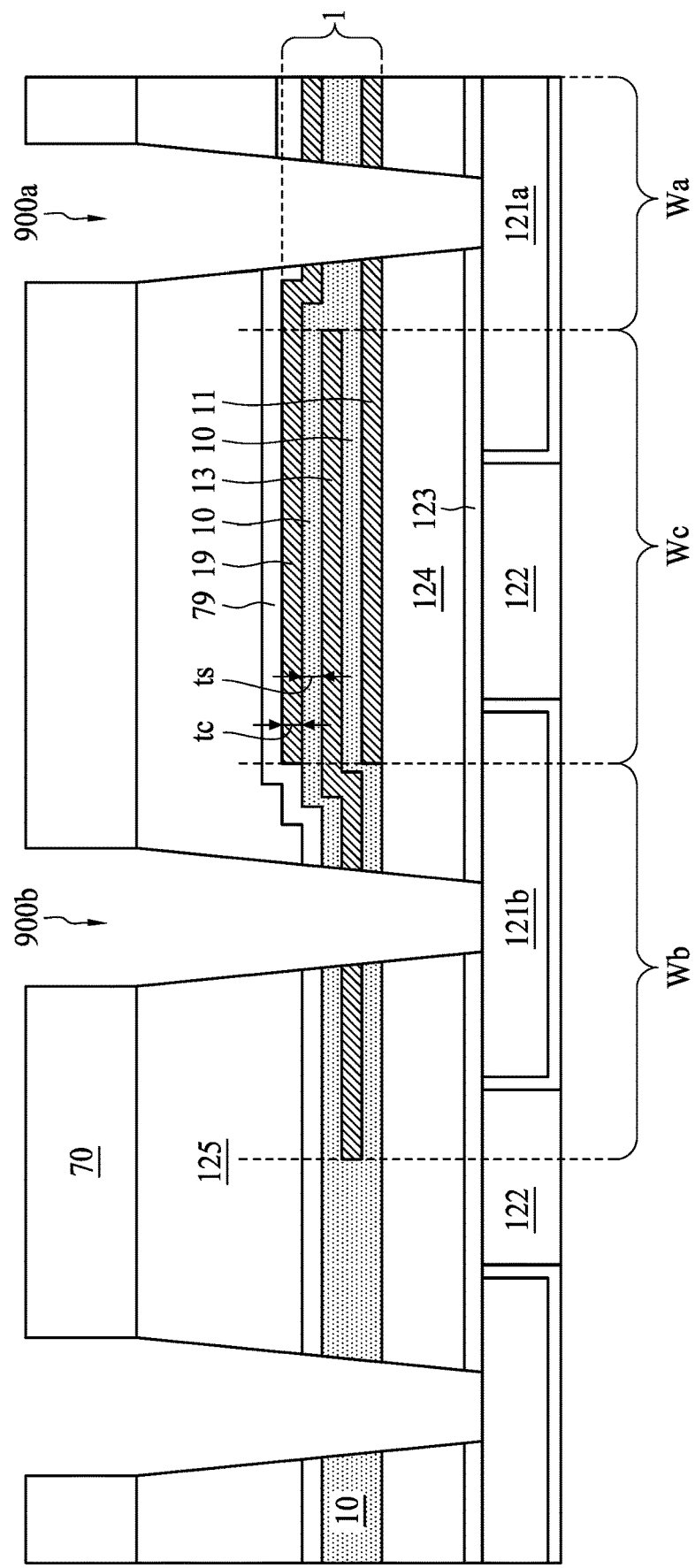

Referring to FIG. 3E, FIG. 3E is a cross section of a semiconductor structure during an intermediate stage of manufacturing operations, in accordance with some embodiments of the present disclosure. A photomask 70 is disposed above the second passivation layer 125. A first via trench 900a and a second via trench 900b are formed above the first metal line 121a and the second metal line 121b respectively by dry etching operation, and the second via trench 900b are recessed from a top surface of the second passivation layer 125 to first metal line 121a and the second metal line 121b respectively. The first via trench 900a penetrates the bottom terminal 11, the top terminal 19, the high-k dielectric layer 10, the first passivation layer 124, the second passivation layer 125, and optionally the bottom etch stop layer 123. The second via trench 900b penetrates the middle terminal 13, the high-k dielectric layer 10, the first passivation layer 124, the second passivation layer 125, and optionally the bottom etch stop layer 123. The end points of etching the first via trench 900a and the second via trench 900b are controlled by the bottom etch stop layer 123. A sidewall of the first passivation layer 124, a sidewall of the second passivation layer 125, a sidewall of at least one of the terminals (e.g. a sidewall of the middle terminal 13, a sidewall of the bottom terminal 11, and/or a sidewall of the top terminal 19), a sidewall of the high-k dielectric layer 10, a sidewall of the capping layer 79, and optionally a sidewall of the bottom etch stop layer 123 are thereby exposed. The photomask 70 is removed subsequently.

Figure 3F:
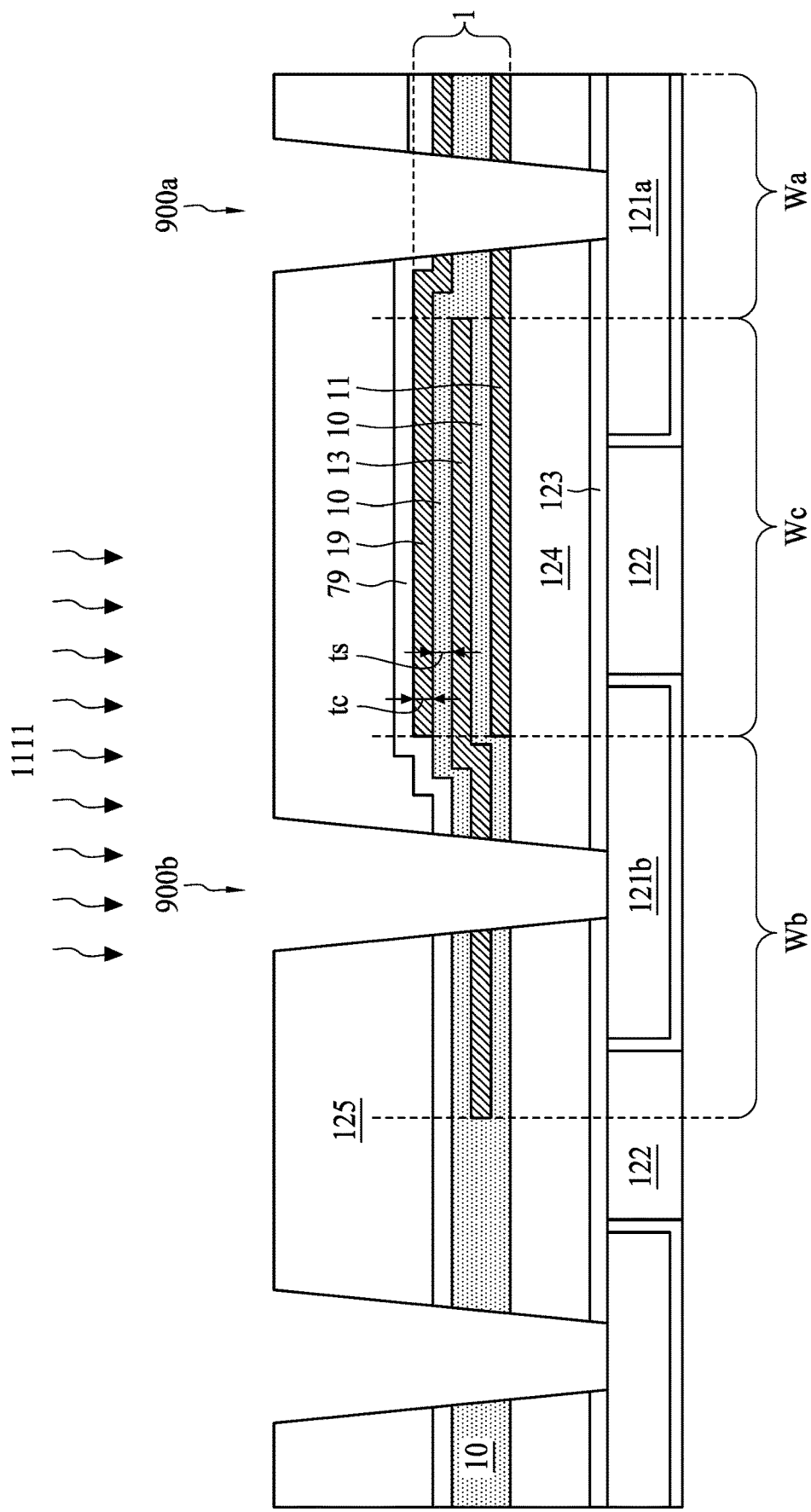

Referring to FIG. 3F, FIG. 3F is a cross section of a semiconductor structure during an intermediate stage of manufacturing operations, in accordance with some embodiments of the present disclosure. During the etching operation performed as described in FIG. 3E, some chemical residues may be deposited on the sidewall of the first via trench 900a and the second via trench 900b. A material of the first passivation layer 124, a material of the second passivation layer 125, a material of terminals (including the bottom terminal 11, the middle terminal 13, and the top terminal 19), a material of the high-k dielectric layer 10, a material of the capping layer 79, and/or a material of the bottom etch stop layer 123 may generate residues under dry etch operation or wet etch operation. Specifically, the aforesaid materials including oxide may have higher tendency to generate residues. Therefore, a cleaning solution 1111 is applied in the first via trench 900a and the second via trench 900b to remove the residues therefrom. In some embodiments, the cleaning solution 1111 may include acid solution. In some embodiments, the cleaning solution 1111 may include base solution. In some embodiments, the cleaning solution 1111 may include hydrogen peroxide. In some embodiments, the cleaning solution 1111 may be a solution including hydrogen peroxide and a weak base chemical.

However, some cleaning solution is corrosive to the sidewall of the first via trench 900a and the sidewall of the second via trench 900b. The sidewall of the first via trench 900a and the sidewall of the second via trench 900b may include the material of the first passivation layer 124, the material of the second passivation layer 125, the material of terminals (including the bottom terminal 11, the middle terminal 13, and the top terminal 19), the material of the high-k dielectric layer 10, the material of the capping layer 79, and/or the material of the bottom etch stop layer 123. If the cleaning solution is corrosive to any of the materials listed above, the cleaning solution 1111 may damage a sidewall of the first via trench 900a and a sidewall of the second via trench 900b. Specifically, the high-k dielectric layer 10 has a high risk to be significantly damaged. The damage done on a sidewall of the first via trench 900a and a sidewall of the second via trench 900b may cause stress concentration, which may subsequently induce cracks, voids, defects, and/or delamination when external force or stress of structures applied thereon. The voids, defects, or cracking can cause reliability issues in subsequent fabrication operations.

Figure 3G:
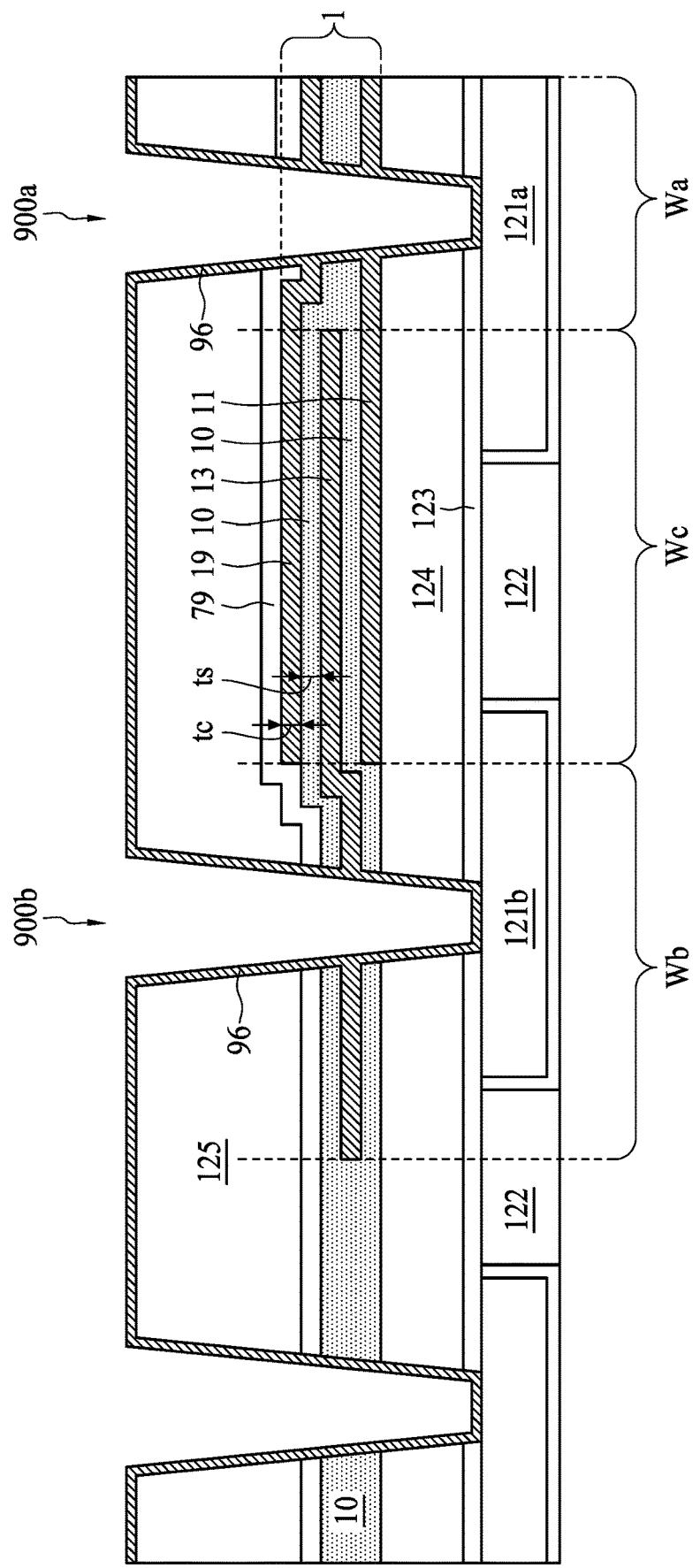
Figure 3H:
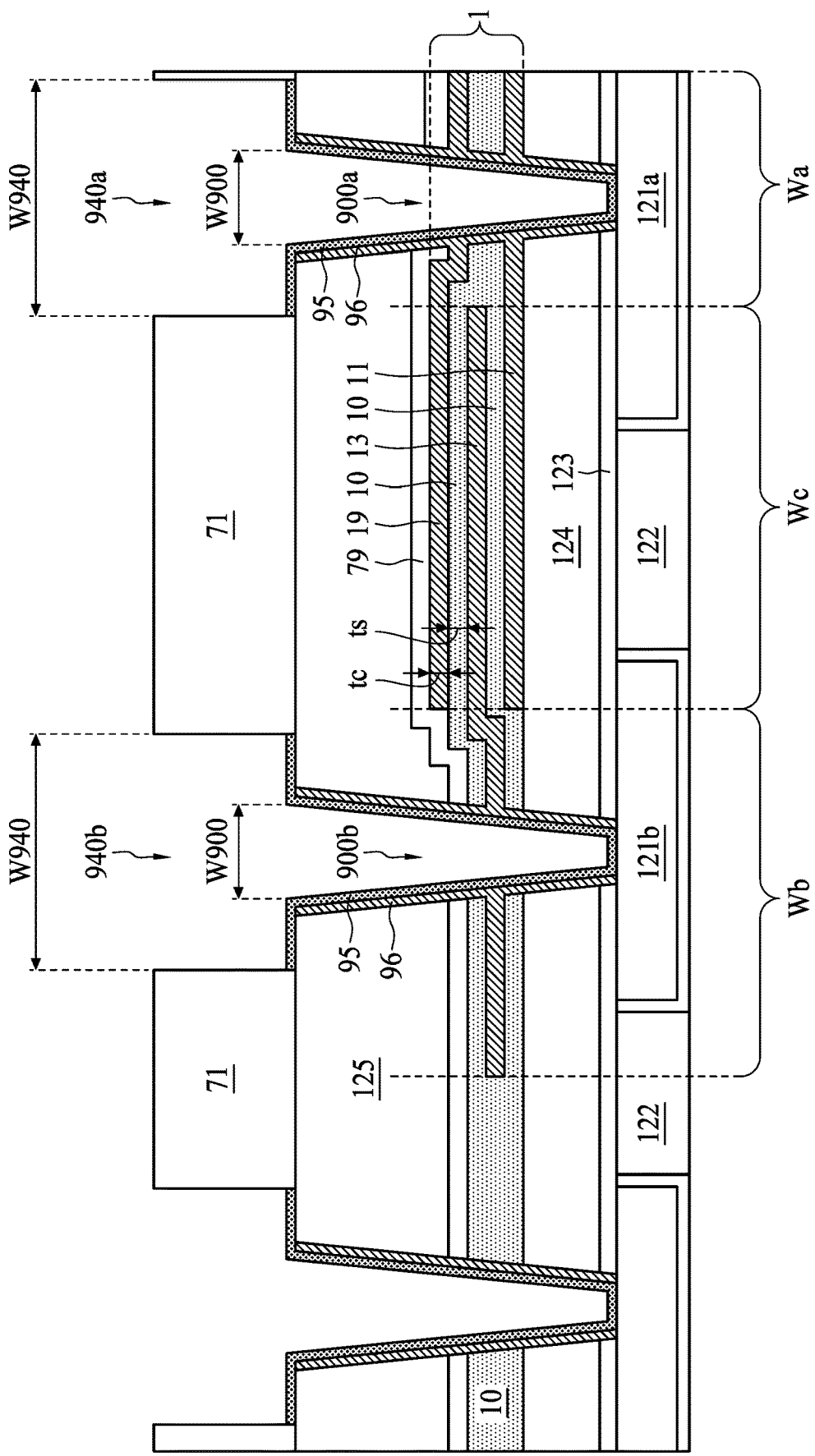

Referring to FIG. 3G, FIG. 3G is a cross section of a semiconductor structure during an intermediate stage of manufacturing operations, in accordance with some embodiments of the present disclosure. In order to alleviate the stress concentration caused by damage on the sidewall of the first via trench 900a and the sidewall of the second via trench 900b damaged by the cleaning solution 1111 or damaged under etching operation, the spacer 96 is conformably formed at least on the sidewall of the first via trench 900a and the sidewall of the second via trench 900b. The spacer 96 may fill in the voids, cracks, or recesses on the sidewall of the first via trench 900a and the sidewall of the second via trench 900b, and may further provide smoother and stronger (i.e. greater mechanical strength) sidewalls of the first via trench 900a and the second via trench 900b. By filling in the voids, cracks, or recesses on the damaged sidewalls of the first via trench 900a and the second via trench 900b, the issue of stress concentration may be alleviated, as the yield rate of products fabricated subsequently can be improved. In addition, a structure of the spacer 96 may be stronger than the sidewalls of the first via trench 900a and the second via trench 900b, therefore the spacer 96 can enhance the mechanical strength of the first via trench 900a and the second via trench 900b, thus alleviate the risk of cracking, delamination, peeling, or inducing voids in subsequent fabrication operations.

The spacer 96 may be formed by various deposition operations. In some embodiments, the spacer 96 is formed by blanket deposition, wherein the spacer 96 is formed on the sidewall of the first via trench 900*a*, on the sidewall of the second via trench 900*b*, directly above the second passivation layer 125, above the exposed portion of the first metal line 121*a*, and above the exposed portion of the second metal line 121*b*. In some embodiments, a material of the spacer 96 can be identical to the material of one of the top terminal 19, the middle terminal 13, and the bottom terminal 11, for example, titanium nitride (TiN) or other suitable materials previously introduced. In some embodiments, a thickness of the spacer 96 is in a range from 1,000 Angstrom to 2,000 Angstrom.

Subsequent to the blanket deposition of the spacer 96, at least a portion of the spacer 96 above the second passivation layer 125 is removed. The portion of the spacer 96 above the second passivation layer 125 may be removed by etching operation, such as dry etching, or the like. In some embodiments, the spacer 96 over the first metal line 121*a* and the second metal line 121*b* are further removed. In some other embodiments, the spacer 96 directly on the first metal line 121*a* and the second metal line 121*b* are not removed.

Figure 3I:
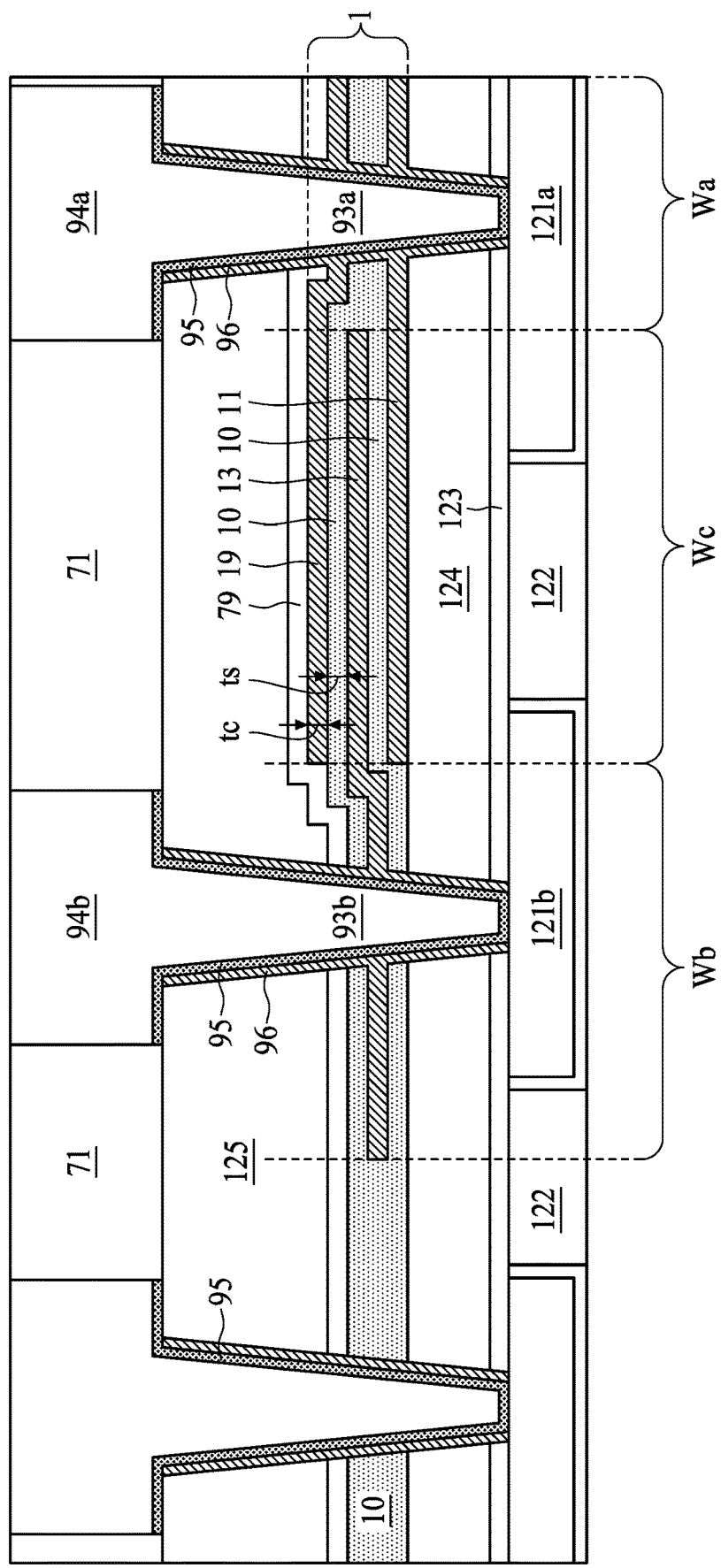

Referring to FIG. 3I1, FIG. 3I1 is a cross section of a semiconductor structure during an intermediate stage of manufacturing operations, in accordance with some embodiments of the present disclosure. A photomask layer 71 is disposed above the second passivation layer 125. The photomask layer 71 is patterned to form a first opening 940*a* and a second opening 940*b*, wherein the first opening 940*a* and the second opening 940*b* are aligning with the first trench 900*a* and the second trench 900*b*, respectively. A width W940 of the first opening 940*a* or the second opening 940*b* is greater than a width W900 of top opening of the first via trench 900*a* and the second via trench 900*b*.

The barrier layer 95 is subsequently formed over a sidewall of the spacer 96 and over a top portion of the second passivation layer 125 exposed from the photomask 71. The barrier layer 95 may further be formed above the first metal line 121*a* and the second metal line 121*b*, or in some other embodiments, over the spacer 96 above the first metal line 121*a* and the second metal line 121*b* if the spacer 96 above the first metal line 121*a* and the second metal line 121*b* is not removed in previous operation. The barrier layer 96 may alleviate diffusion between the first metal line 121*a* and the first via 93*a*, as well as the second metal line 121*b* and the second via 93*b*. In some embodiments, the barrier layer 95 may include tantalum (Ta), tantalum nitride (TaN), titanium nitride (TiN), the combination thereof, or the like.

Referring to FIG. 3I, FIG. 3I is a cross section of a semiconductor structure during an intermediate stage of manufacturing operations, in accordance with some embodiments of the present disclosure. A conductive material is formed inside first via trench 900*a*, the second via trench 900*b*, the first opening 940*a*, and the second opening 940*b*. The conductive material can formed by a variety of techniques, e.g., deposition, electro plating, electro-less plating, sputtering, physical vapor deposition (PVD), atomic layer deposition (ALD), or the like. In some embodiments, the conductive material is aluminum copper (AlCu). In some embodiments, a planarization operation is performed to remove the excessive conductive material above a top surface of the photomask 71, and the first conductive post 94*a* and the second conductive post 94*b* are thereby formed above the second passivation layer 125.

Figure 3J:
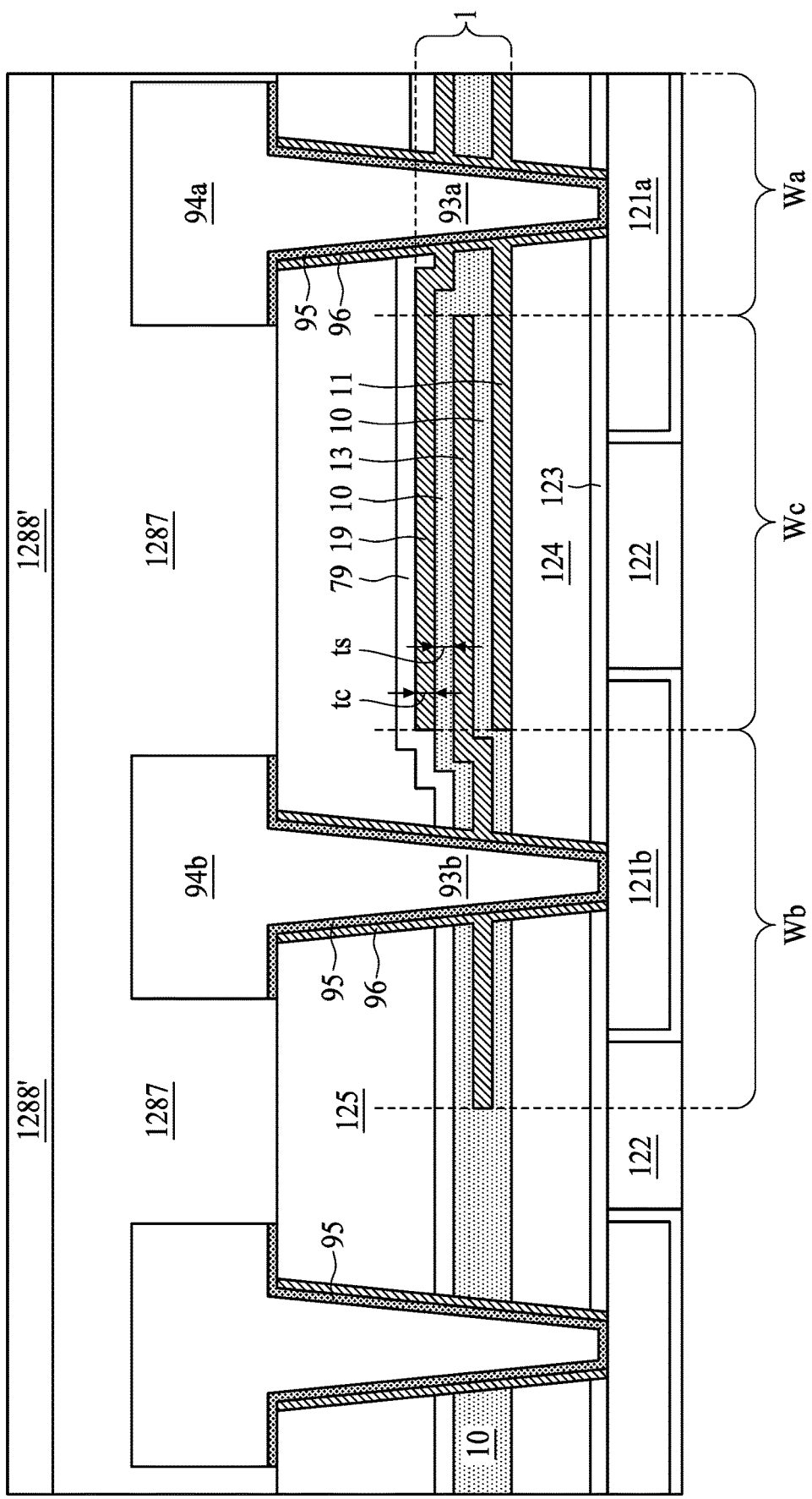

Referring to FIG. 3J, FIG. 3J is a cross section of a semiconductor structure during an intermediate stage of manufacturing operations, in accordance with some embodiments of the present disclosure. The photomask 71 is subsequently removed. The upper passivation layer 1287 is formed above the second passivation layer 125 and surrounding the first conductive post 94*a* and the second conductive post 94*b*. The upper passivation layer 1287 may be formed by a variety of techniques, e.g., spin-on coating, deposition, plasma enhanced deposition, or the like. The upper etch stop layer 1288' is formed above the upper passivation layer 1287.

Figure 3K:
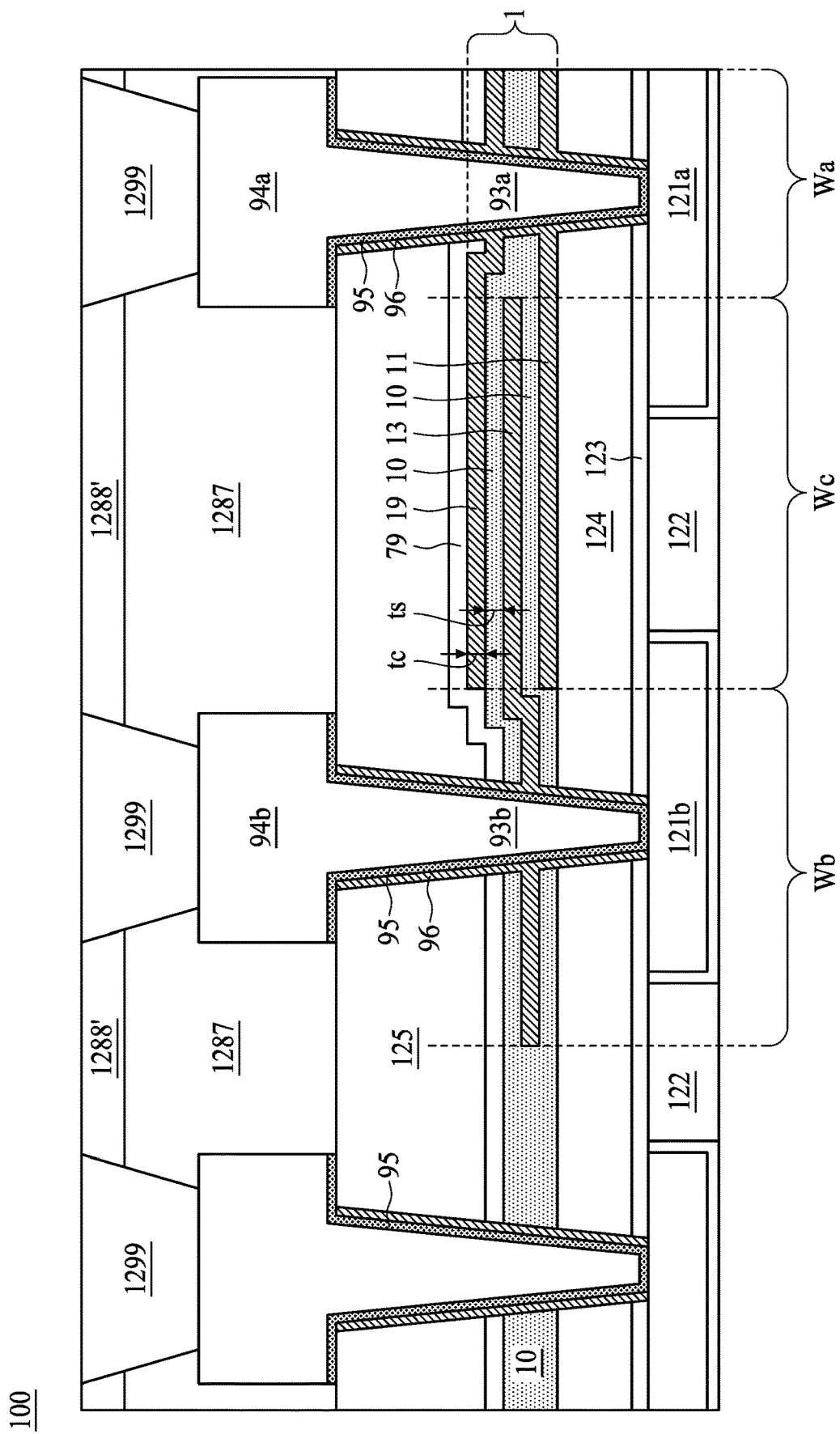

Referring to FIG. 3K, FIG. 3K is a cross section of a semiconductor structure during an intermediate stage of manufacturing operations, in accordance with some embodiments of the present disclosure. The metal contact 1299 is formed above and being electrically connected to each of the first conductive post 94*a* and the second conductive post 94*b*. A planarization operation is performed to remove excessive material of the metal contact 1299 above the upper etch stop layer 1288'. The metal contact 1299 may optionally be electrically connected to or bonded to other semiconductor structures subsequently.

Some embodiments of the present disclosure provide a semiconductor structure, including a bottom terminal, a middle terminal over the bottom terminal and separated from the bottom terminal by a high-k dielectric layer, a top terminal over the middle terminal and separated from the middle terminal by the high-k dielectric layer, and a silicon nitride layer over the top terminal and directly on the high-k dielectric layer.

Some embodiments of the present disclosure provide a semiconductor structure, including a bottom terminal, a middle terminal over the bottom terminal and separated from the bottom terminal by a high-k dielectric layer, a top terminal over the middle terminal and separated from the middle terminal by the high-k dielectric layer, a via penetrating the bottom terminal, and a spacer on a sidewall of the via.

Some embodiments of the present disclosure provide a method for fabricating a semiconductor structure, including forming a bottom terminal over a top metal layer, forming a middle terminal over the bottom terminal, forming a top terminal over the middle terminal, forming a high-k dielectric layer between the bottom terminal and the middle terminal, and between the middle terminal and the top terminal, forming a silicon nitride layer over the top terminal, and forming a via trench penetrating the bottom terminal.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a bottom terminal;
   a middle terminal over the bottom terminal and separated from the bottom terminal by a high-k dielectric layer;
   a top terminal over the middle terminal and separated from the middle terminal by the high-k dielectric layer;
   a silicon nitride layer over the top terminal and directly on the high-k dielectric layer;
   a passivation layer over the silicon nitride layer;
   a conductive via penetrating bottom terminal;
   a spacer on a sidewall of the conductive via, wherein the spacer comprises titanium nitride;
   a conductive post over the passivation layer; and
   a barrier layer at a sidewall of the conductive via and extending over a portion of the passivation layer, the barrier layer being free from separating the conductive via and the conductive post,
   wherein a thickness of the passivation layer is greater than a thickness of the silicon nitride layer.

2. The semiconductor structure of claim 1, wherein the conductive via penetrates the bottom terminal.

3. The semiconductor structure of claim 2, wherein the conductive via is composed of aluminum-copper.

4. The semiconductor structure of claim 1, wherein the spacer contacts the high-k dielectric layer and at least one of the bottom terminal, the middle terminal, and the top terminal.

5. The semiconductor structure of claim 1, wherein the spacer contacts with the silicon nitride layer.

6. The semiconductor structure of claim 1, wherein a thickness of the silicon nitride layer is comparable to a thickness of one of the bottom terminal, the middle terminal, and the top terminal.

7. The semiconductor structure of claim 1, wherein the high-k dielectric layer comprises a tri-layer of zirconium oxide-aluminum oxide-zirconium oxide.

8. A semiconductor structure, comprising:
   a bottom terminal;
   a middle terminal over the bottom terminal and separated from the bottom terminal by a high-k dielectric layer;
   a top terminal over the middle terminal and separated from the middle terminal by the high-k dielectric layer;
   a silicon nitride layer over the top terminal;
   a passivation layer over the silicon nitride layer;
   a conductive via penetrating the bottom terminal, the silicon nitride layer, and the passivation layer, and in connection with a conductive post over the passivation layer;
   a spacer on a sidewall of the conductive via, wherein the spacer comprises titanium nitride; and
   a barrier layer in contact with the spacer and extends over a portion of the passivation layer, the barrier layer being composed of material different from that of the spacer.

9. The semiconductor structure of claim 8, wherein the conductive via is composed of aluminum-copper.

10. The semiconductor structure of claim 8, wherein the silicon nitride layer over the top terminal is directly on the high-k dielectric layer.

11. A method for fabricating a semiconductor structure, comprising:
    forming a bottom terminal over a top metal layer;
    forming a middle terminal over the bottom terminal;
    forming a top terminal over the middle terminal;
    forming a high-k dielectric layer between the bottom terminal and the middle terminal, and between the middle terminal and the top terminal;
    forming a silicon nitride layer over the top terminal;
    forming a passivation layer over the silicon nitride layer;
    forming a via trench penetrating the bottom terminal, the silicon nitride layer, the high-k dielectric layer, and the passivation layer;
    forming a spacer over a sidewall of the via trench and over the top terminal; and
    etching the spacer to remove a portion of the spacer over the top terminal.

12. The method of claim 11, wherein forming the via trench penetrating the bottom terminal, the silicon nitride layer, the high-k dielectric layer, and the passivation layer comprises performing dry etch to remove the silicon nitride layer, the high-k dielectric layer, and at least the bottom terminal.

13. The method of claim 11, further comprising applying a cleaning solution in the via trench prior to forming the spacer.

14. The method of claim 11, further comprising filling conductive material in the trench after forming the spacer.

15. The method of claim 11, wherein etching the spacer further comprises removing a portion of the spacer at a bottom of the via trench.

16. The method of claim 11, further comprising forming a barrier layer over a sidewall of the via trench and over the passivation layer after forming the spacer.

17. The method of claim 16, further comprising patterning a photomask over the passivation layer prior to forming the barrier layer.

18. The method of claim 11, wherein forming the silicon nitride layer over the top terminal comprises forming a conformal layer over the high-k dielectric layer and the top terminal.

19. The method of claim 18, wherein a thickness of the silicon nitride layer is comparable to a thickness of the bottom terminal, the middle terminal, or the top terminal.

20. The method of claim 18, wherein a thickness of the silicon nitride layer is in a range of from about 500 Angstrom to about 1,000 Angstrom.

* * * * *